(12) United States Patent
Matsuda et al.

(10) Patent No.: US 7,193,157 B2
(45) Date of Patent: Mar. 20, 2007

(54) FLEXIBLE CIRCUIT BOARD MOUNTED WITH SEMICONDUCTOR CHIP AND METHOD FOR MOUNTING SEMICONDUCTOR CHIP

(75) Inventors: Atsusi Matsuda, Yamagata (JP); Hidetaka Ohazama, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 5 days.

(21) Appl. No.: 10/902,265

(22) Filed: Jul. 30, 2004

(65) Prior Publication Data
US 2005/0039945 A1    Feb. 24, 2005

(30) Foreign Application Priority Data
Jul. 30, 2003    (JP) .............................. 2003-203478

(51) Int. Cl.
*H05K 1/00*    (2006.01)
(52) U.S. Cl. ................ 174/254; 174/260; 361/760; 29/832
(58) Field of Classification Search ................ 174/254, 174/260; 361/749, 760; 257/778, 780, 779, 257/737, 738; 29/832
See application file for complete search history.

(56) References Cited

U.S. PATENT DOCUMENTS 6,107,685 A * 8/2000 Nishiyama .................. 257/737
6,657,137 B2 * 12/2003 Miyake et al. .............. 174/52.1
6,750,549 B1 * 6/2004 Chandran et al. ........... 257/780
6,940,176 B2 * 9/2005 Chen .......................... 257/778
6,940,178 B2 * 9/2005 Kweon et al. ............... 257/780

FOREIGN PATENT DOCUMENTS

JP    2000-286536    10/2000

* cited by examiner

*Primary Examiner*—Ishwar I. B. Patel
(74) *Attorney, Agent, or Firm*—Arent Fox PLLC (57) ABSTRACT

A flexible circuit board is provided to prevent unsuccessful interconnection between the wirings of the flexible circuit board and the output terminals of a semiconductor chip, the flexible circuit board having a plurality of sections of wirings of different sizes, each section including a pattern of wirings of the same size. The flexible circuit board has predetermined patterns of wirings on an insulating material base, and the wirings are electrically connected to the output terminals of a semiconductor chip. A pattern of the wirings of the same size forms a first wiring section, while another pattern of the wirings of the same size form a second wiring section. The flexible circuit board is provided with a pattern transition region between the neighboring wiring sections with wirings of different sizes to avoid unsuccessful interconnection which would be otherwise caused by the difference in size between the wirings.

11 Claims, 7 Drawing Sheets

FLEXIBLE CIRCUIT BOARD MOUNTED WITH SEMICONDUCTOR CHIP AND METHOD FOR MOUNTING SEMICONDUCTOR CHIP

BACKGROUND OF THE INVENTION

The present invention relates to a flexible circuit board, a flexible circuit board mounted with a semiconductor chip, a display device, and a method for mounting a semiconductor chip.

The present application claims priority from Japanese Patent Application No. 2003-203478, the disclosure of which is incorporated herein by reference.

Electronic appliances, such as mobile phones or PDAs (Personal Digital Assistants or portable information terminals), have been required to have reduced sizes and weights and provide enhanced performance. This in turn requires their electronic components to be more densely incorporated upon the printed circuit board. In particular, thin flat-panel display devices, which are incorporated into such an electronic appliance to provide as large display screen as possible, require their wired driver components accommodated around the screen to be packed as densely as possible. To meet this requirement, the chip-on-film (abbreviated as COF) technique has been often employed these days in which wirings of a flexible circuit board and output terminals of a semiconductor chip are directly bonded to each other to mount the semiconductor chip on the flexible circuit board.

With the COF technique, a pattern of the wirings on the flexible circuit board has to be formed corresponding to a pattern of the output terminals (bumps) of the semiconductor chip. The wiring pattern of the flexible circuit board may be often formed using a pattern forming technique referred to as a semi-additive or full-additive method as described in Japanese Patent Application Laid-Open No. 2000-286536.

Figure 1:
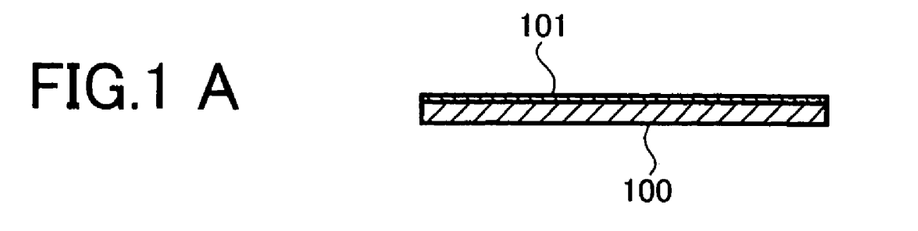
FIGS. 1A to 1D are explanatory views illustrating a conventional technique of forming a wiring pattern on a flexible circuit board.

Now, referring to FIGS. 1A through 1D, this conventional technique will be described below. As shown in FIG. 1A, a surface of a flexible insulating material base 100 is first covered with a seed layer 101 which is to serve as plated leads. Then, as shown in FIG. 1B, a patterned mask 102 of a photoresist material or the like is formed on the surface of the seed layer 101 to provide a desired pattern of wirings. Then, as shown in FIG. 1C, an electrically conductive material such as nickel or copper is deposited by electrolytic plating over exposed regions of the seed layer 101 to form a pattern of wirings 103. Additionally, as required, a surface conductive layer 104 of a dissimilar metal such as gold is formed on top of the patterned wirings 103 by electrolytic plating or a deposition method such as sputter or vapor deposition. Subsequently, as shown in FIG. 1D, the patterned mask 102 and the seed layer 101 underlying the mask 102 are removed, thereby forming a flexible circuit board with the desired pattern of wirings made up of seed layer portions 101A, the patterned wirings 103, and the surface conductive layer 104 on the insulating material base 100.

On the other hand, the array pattern of output terminals (bumps) of a semiconductor chip depends on the arrangement of terminals of an electronic appliance to be driven or the configuration of circuit blocks inside the semiconductor chip. In general, the array pattern may often be a non-uniform pattern of terminals, in the case of which the array includes bumps of different dimensions with the bumps of the same dimensions collected in groups, in which the groups are distributed unevenly.

To use the COF technique for mounting a semiconductor chip having bumps of different dimensions as mentioned above, it is necessary to form patterns of wirings of different widths corresponding to the dimensions of the bumps in order to connect the bumps to the wirings on the flexible circuit board with high accuracy. Forming such patterns of wirings is a critical design requirement for an electronic appliance whose performance is significantly affected by the magnitude of drive currents. In particular, this type of wiring pattern design is essential to the flexible circuit board which is incorporated into an organic EL display device, or a spontaneous light-emitting flat panel display receiving attention these days, in which the magnitude of drive currents have direct effects on display performance.

However, employing the conventional wiring pattern forming technique to form such patterns of wirings of different widths would lead to the following problem.

That is, forming patterns of wirings of different widths by electrolytic plating would cause a wiring material to be deposited in a larger thickness on a wider wiring but in a smaller thickness on a narrower wiring. This phenomenon results from the fact that a wider wiring provides a less voltage drop due to the resistance thereof than a narrower wiring during electrolytic plating. Upon bonding the bumps of the semiconductor chip to the patterned wirings of the flexible circuit board via an anisotropic conductive film by thermo-compression, such a difference in thickness between the patterns of wirings would readily cause unsuccessful bonding of neighboring wirings in a stepped portion.

Figure 2:
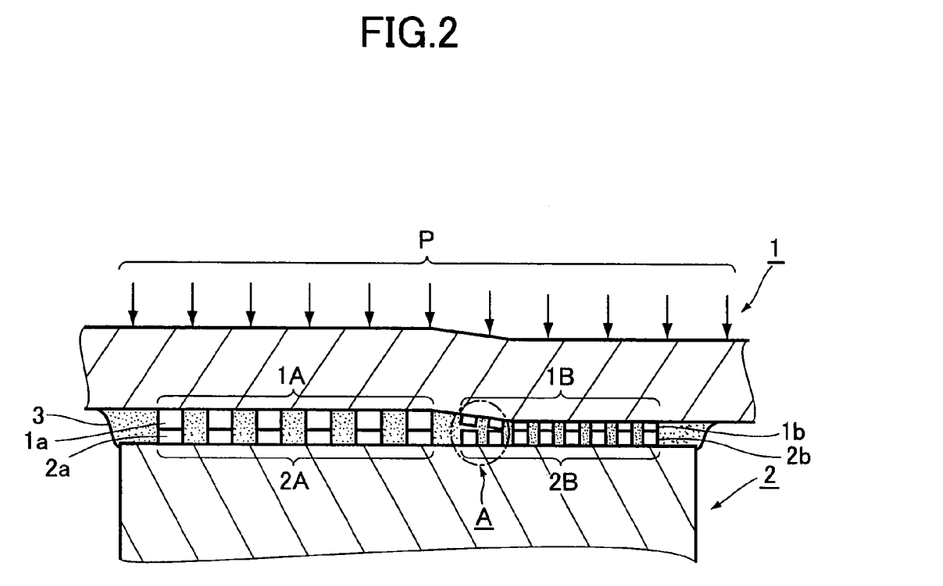
FIG. 2 is an explanatory view illustrating problems with the conventional technique.

This will now be explained more specifically in accordance with the example shown in FIG. 2. On a flexible circuit board 1, formed are a first wiring section 1A having a pattern of wider wirings 1a of the same size and a second wiring section 1B having a pattern of narrower wirings 1b of the same size. On the other hand, a semiconductor chip 2 is provided with a first bump section 2A having a pattern of wider bumps 2a of the same size and a second bump section 2B having a pattern of narrower bumps 2b of the same size. The wirings 1a and the bumps 2a having the same pattern and width as well as the wirings 1b and the bumps 2b having the same pattern and width are abutted against each other via an anisotropic conductive film 3, respectively, and then heated under a pressure P for thermo-compression.

At the boundary portion between the first wiring section 1A and the second wiring section 1B, the aforementioned difference in thickness between the wirings caused by the widths thereof defines a height difference between the levels of the bonding surfaces of the wirings (or stepped portion). Effecting a thermo-compression under this condition would cause the pressure to be insufficiently applied to a neighboring portion A around the stepped portion due to the existence of the stepped portion, resulting in an insufficient compression and thus unsuccessful bonding at the neighboring portion A.

To address this problem, the wirings 1a in the first wiring section 1A and the wirings 1b in the second wiring section 1B could be made the same in thickness. However, providing the same thickness to the wirings of different sizes would requires a special processing technique, which could be employed only with extreme difficulties to process such a fine pattern of wirings, thus causing an increase in the manufacturing costs of the flexible circuit board.

SUMMARY OF THE INVENTION

The present invention was developed in view of the aforementioned problems, such as with boding the output terminals of a semiconductor chip to a flexible circuit board having a plurality of sections of wirings of different sizes, each section having a pattern of wirings of the same size. It is therefore an object of the present invention to prevent unsuccessful bonding between the wirings and the output terminals. It is another object of the invention to form patterns of wirings corresponding to the semiconductor chip having output terminals of different dimensions to provide interconnection therebetween with high accuracy. It is still another object of the invention to thereby eliminate unevenness in drive currents which would be otherwise caused by variations in resistance across bonding surfaces, thus providing good performance to an electronic appliance, particularly to an organic EL display device whose display performance is directly affected by the magnitude of the drive currents.

To achieve the aforementioned objects, the present invention is provided with at least the features according to the following aspects.

According to a first aspect of the present invention, a flexible circuit board with predetermined patterns of wirings to be electrically connected to output terminals of a semiconductor chip, wherein a plurality of sections of wirings of different sizes are formed, each section having a pattern of the wirings of the same size, and a pattern transition region is formed between adjacent sections of the wirings of different sizes to prevent unsuccessful interconnection otherwise caused by a difference in size between the wirings.

According to a second aspect of the present invention, a method for mounting a semiconductor chip onto a flexible circuit board by electrically connecting predetermined patterns of output terminals of the semiconductor chip to patterns of wirings of the flexible circuit board, the patterns of wirings corresponding to the patterns of output terminals, the method comprising the steps of: providing a flexible circuit board having a plurality of sections of wirings of different sizes formed thereon, each section having a pattern of the wirings of the same size, and a pattern transition region formed between adjacent sections of the wirings of different sizes to prevent unsuccessful interconnection otherwise caused by a difference in size between the wirings; and aligning the patterns of the output terminals with the patterns of the wirings in the wiring sections for electrical interconnection.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 3:
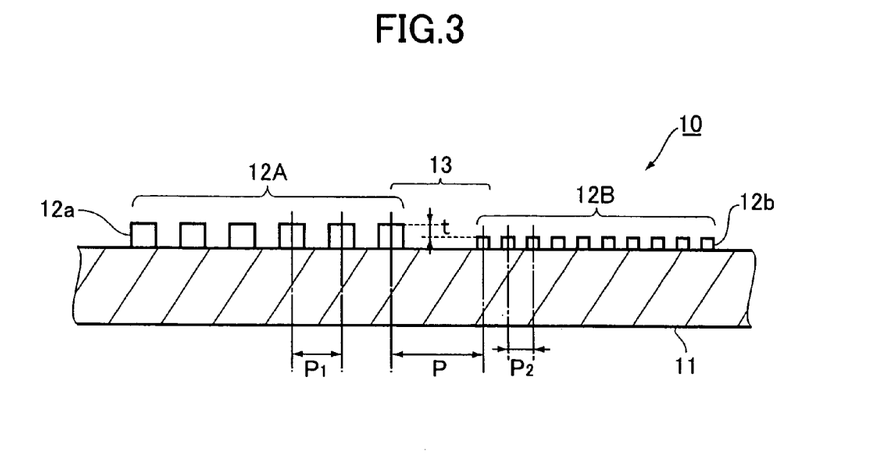
FIG. 3 is an explanatory view illustrating a flexible circuit board according to an embodiment of the present invention.

Now, the present invention will be described below in more detail with reference to the accompanying drawings in accordance with the embodiments. FIG. 3 is an explanatory view illustrating a flexible circuit board according to an embodiment of the present invention. On an insulating material base 11, a flexible circuit board 10 has predetermined patterns of wirings 12a, 12b which are electrically connected to the output terminals of a semiconductor chip. A pattern of the wirings 12a of the same size is formed in a first wiring section 12A, while another pattern of the wirings 12b of the same size is formed in a second wiring section 12B. The present invention is not limited to the two sections 12A, 12B of wirings as shown in the figure, but may also employ a plurality of sections of wirings of different sizes, each section including a pattern of wirings of the same size.

In the example illustrated, a difference in size between the wirings is a difference in thickness therebetween caused by the widths thereof, the wirings 12a being wider and thicker, while the wirings 12b being narrower and thinner. Accordingly, at the boundary between the first wiring section 12A and the second wiring section 12B, the difference in thickness between the wirings caused by the widths thereof defines a height difference "t" between the levels of the bonding surfaces of the wirings.

In this embodiment of the present invention, the flexible circuit board 10 is provided with a pattern transition region 13 between the neighboring wiring sections 12A and 12B of wirings of different sizes to avoid unsuccessful interconnection which would be otherwise caused by the difference in size between the wirings.

In the embodiment illustrated in FIG. 3, the pattern transition region 13 has a wiring interval P which is larger than any of the wiring intervals P1 and P2 in the adjacent wiring sections 12A, 12B.

Figure 4:
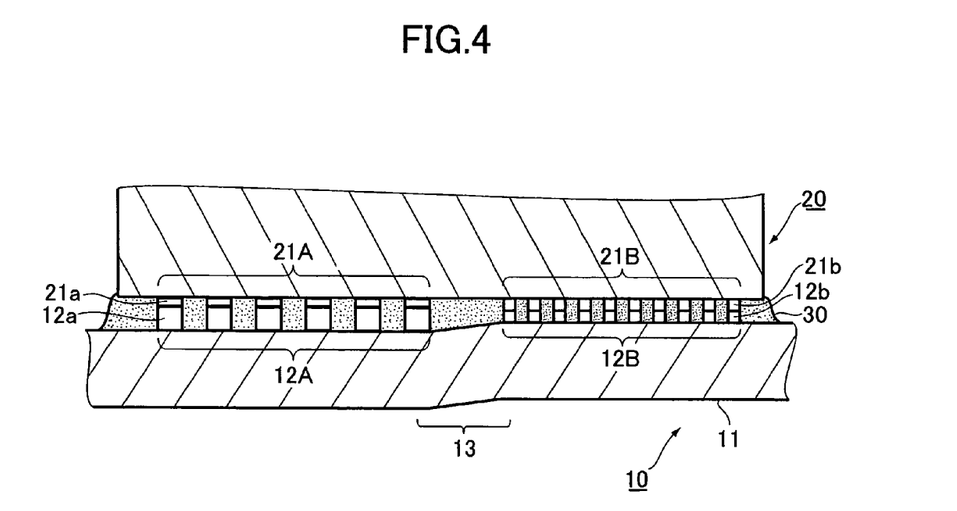
FIG. 4 is an explanatory view illustrating a flexible circuit board mounted with a semiconductor chip according to an embodiment of the present invention.

FIG. 4 shows a flexible circuit board mounted with a semiconductor chip in which bumps 21a, 21b or output terminals of a semiconductor chip 20 are electrically connected to the wirings 12a, 12b of the flexible circuit board 10.

The semiconductor chip 20 has bumps 21a, 21b of different dimensions, and is provided with a first bump section 21A consisting of a pattern of wider bumps 21a with the same size and a second bump section 21B consisting of a pattern of narrower bumps 21b with the same size. Accordingly, the wirings 12a, 12b of the flexible circuit board 10 have different widths corresponding to the dimensions of the bumps 21a, 21b. The wirings 12a and the bumps 21a as well as the wirings 12b and the bumps 21b are abutted against each other via an anisotropic conductive film 30, respectively, and then heated under a pressure for thermocompression. In this embodiment, the wirings 12a and the bumps 21a as well as the wirings 12b and the bumps 21b are electrically connected to each other via the anisotropic conductive film 30 by thermo-compression; however, the present invention is not limited thereto but may also employ other bonding techniques such as eutectic bonding, epoxy die bonding, or metal bonding.

In the flexible circuit board 10 according to this embodiment or a flexible circuit board 10 mounted with a semiconductor chip 20, the pattern transition region 13 formed as described above causes the adjacent wirings 12a and 12b to be spaced from each other by an interval P, which accommodates a height difference "t". This in turn allows all the wirings 12a, 12b in each of the wiring sections 12A, 12B to be connected to the bumps 21a, 21b of the semiconductor chip 20 in a good condition without being affected by the height difference "t".

Figure 5:
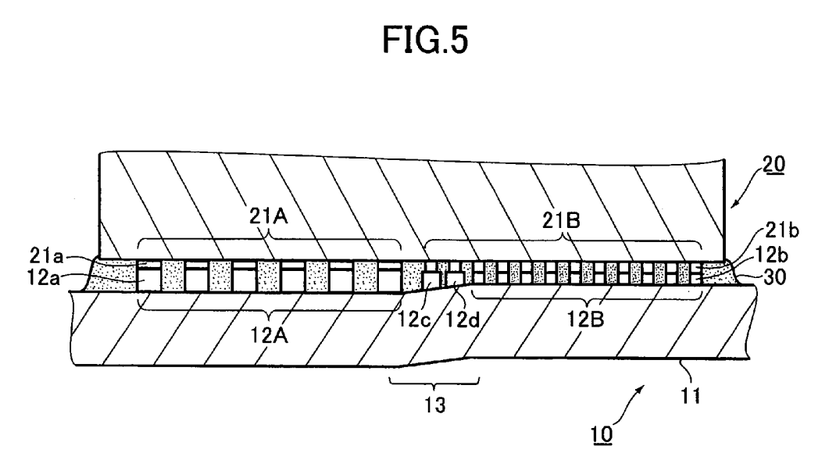
FIG. 5 is an explanatory view illustrating a flexible circuit board mounted with a semiconductor chip according to another embodiment of the present invention.

FIG. 5 is an explanatory view illustrating a flexible circuit board 10 according to another embodiment of the present invention or a flexible circuit board 10 mounted with a semiconductor chip 20. The same components as those of the aforementioned embodiment are indicated by the same reference symbols, and will not be explained repeatedly. This embodiment provides a pattern transition region 13 in which formed are wirings 12c, 12d having a size intermediate between the respective wirings in the adjacent wiring sections 12A, 12B. In the example illustrated, the pattern transition region 13 has two wirings, i.e., the wirings 12c, 12d formed therein; however, at least one wiring may also be formed corresponding to a bump 21b.

The wirings 12c, 12d have a size intermediate between the wirings 12a, 12b in the wiring sections 12A, 12B, thus having a width and a thickness intermediate between those of the wirings 12a and 12b.

In the flexible circuit board 10 according to this embodiment or a flexible circuit board 10 mounted with a semiconductor chip 20, the wirings 12c, 12d of an intermediate size formed in the pattern transition region 13 accommodates the effects of a height difference "t" in a step-wise manner. This in turn allows all the wirings 12a, 12b, 12c, and 12d in each of the wiring sections 12A, 12B and the pattern transition region 13 to be connected to the bumps 21a, 21b of the semiconductor chip 20 in a good condition without being affected by the height difference "t".

Figure 6:
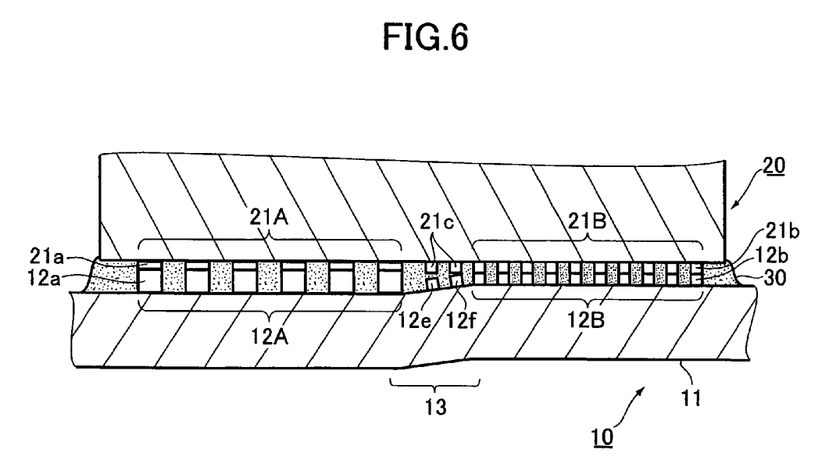
FIG. 6 is an explanatory view illustrating a flexible circuit board mounted with a semiconductor chip according to still another embodiment of the present invention.

FIG. 6 is an explanatory view illustrating a flexible circuit board 10 mounted with a semiconductor chip 20 according to still another embodiment of the present invention. The same components as those of the aforementioned embodiments are indicated by the same reference symbols, and will not be explained repeatedly. This embodiment provides a pattern transition region 13 in which formed are dummy wirings 12e, 12f that are not used for signaling.

That is, between the bump sections 21A and 21B of bumps of different sizes, the semiconductor chip 20 is provided with bumps 21c that are not used for interconnection, while the dummy wirings 12e, 12f are formed in the pattern transition region 13 corresponding to the bumps 21c.

In the flexible circuit board 10 according to this embodiment or a flexible circuit board 10 mounted with a semiconductor chip 20, the dummy wirings 12e, 12f, formed in the pattern transition region 13 in which interconnection could be unsuccessfully provided due to the effects of a height difference "t", and the bumps 21c associated therewith, are not used for interconnection. This allows all the wirings 12a, 12b in each of the wiring sections 12A, 12B, which are used for interconnection, to be connected to the bumps 21a, 21b of the semiconductor chip 20 in a good condition without being affected by the height difference "t".

Figure 8:
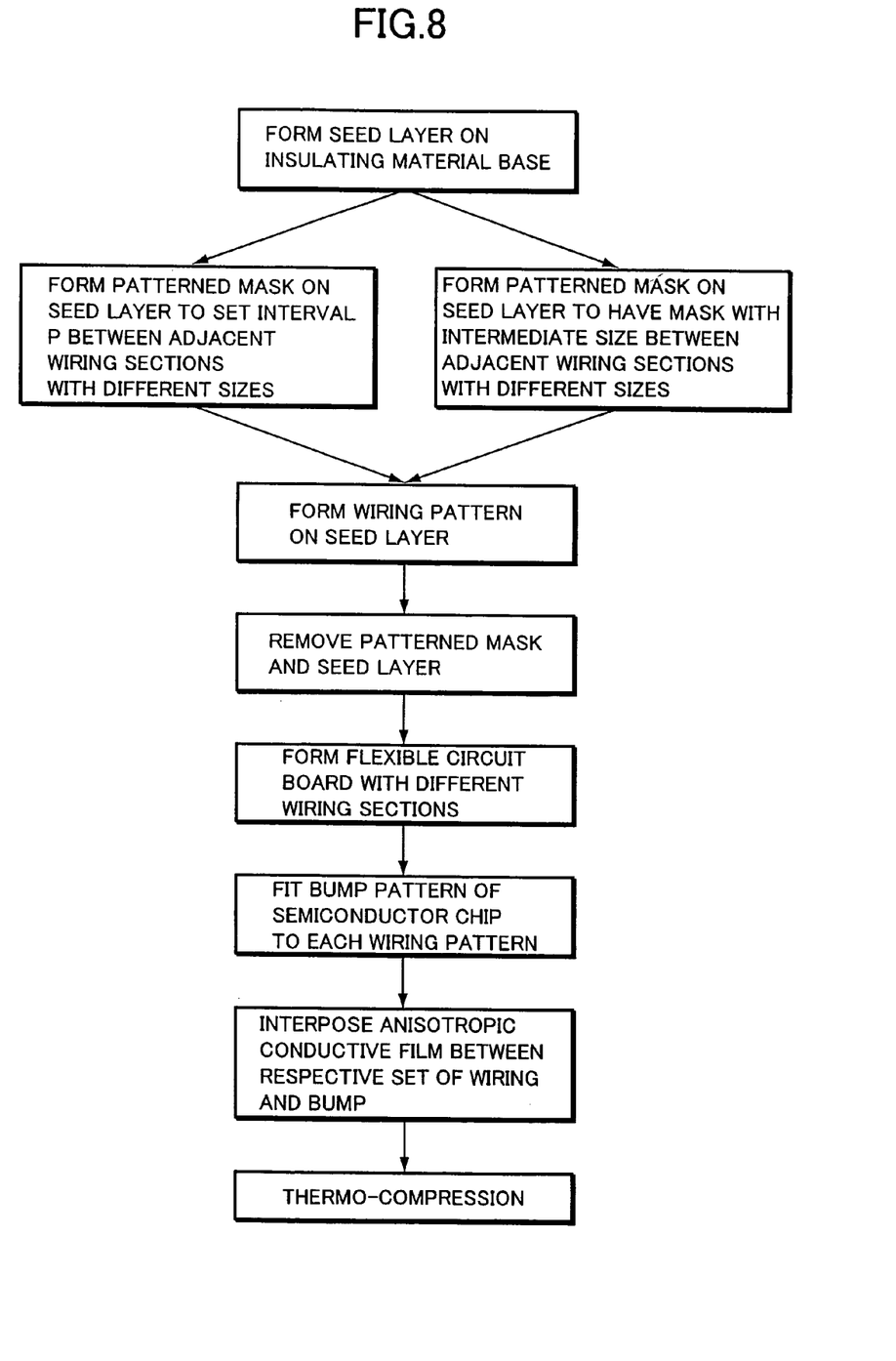
FIG. 8 is a flowchart showing a method for mounting a semiconductor chip on a flexible circuit board according to an embodiment of the present invention.
Figure 9:
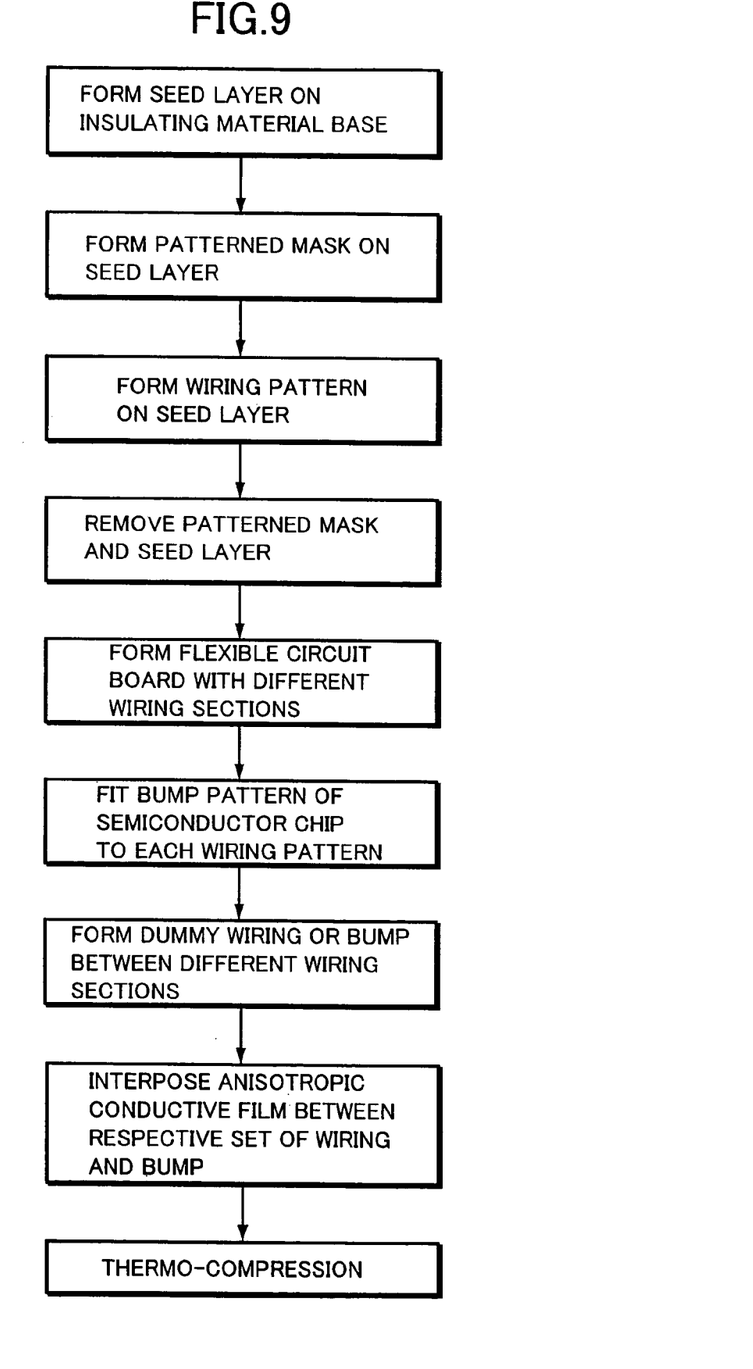
FIG. 9 is a flowchart showing another method for mounting a semiconductor chip on a flexible circuit board according to another embodiment of the present invention.

Now, a description will be given to a method for mounting a semiconductor chip using the flexible circuit board 10 according to each of the aforementioned embodiments or a flexible circuit board 10 mounted with a semiconductor chip 20. As shown in FIGS. 8 and 9, using the flexible circuit board 10 according to each of the aforementioned embodiments, the patterns of the bumps 21a, 21b of the semiconductor chip 20 are each aligned to the patterns of the wirings 12a, 12b in the wiring sections 12A, 12B to bond the semiconductor chip 20 to the flexible circuit board 10 by thermo-compression via the anisotropic conductive film 30 between the wirings 12a, 12b and the bumps 21a, 21b.

At this stage, it is possible to employ the aforementioned semi-additive or the full-additive method depending on the bump patterns of the semiconductor chip 20 in order to form the wiring pattern of the wiring sections 12A, 12B on the flexible circuit board 10.

In the flexible circuit board 10 according to the aforementioned embodiment shown in FIG. 3 or 4, the pattern transition region 13 is formed to have the interval P. In this case, the adjacent sections of wirings of different sizes may be spaced apart from each other by the interval P upon forming the wiring patterns (see FIG. 8). On the other hand, the bump patterns of the semiconductor chip 20 may be designed in accordance with the wiring patterns having the interval P. Alternatively, as shown in FIG. 6, the bump patterns themselves may also be formed by the neglect of the interval P, with the bumps associated with the interval P being formed as dummy terminals.

In the flexible circuit board 10 according to the embodiment shown in FIG. 5, the wirings 12c, 12d of an intermediate size are formed in the pattern transition region 13. In this case, a patterned mask of an intermediate width is formed at the boundary between the sections of wirings of different sizes upon forming the wiring patterns, thereby forming the wirings 12c, 12d with an intermediate width (see FIG. 8).

In the flexible circuit board 10 according to the embodiment shown in FIG. 6, the dummy wirings 12e, 12f are formed in the pattern transition region 13. In this case, the normal wiring patterns themselves of the flexible circuit board 10 may be formed simply corresponding to the bump patterns of the semiconductor chip 20. Bonding the semiconductor chip 20 to the flexible circuit board 10 would allow the dummy wirings 12e, 12f to appear corresponding to the bumps 21c that serve as the dummy terminals of the semiconductor chip 20 (see FIG. 9).

Since a wiring pattern of the flexible circuit board 10 can be readily changed through the design of a patterned mask for forming the wiring pattern or through the formation of dummy terminals, the semiconductor chip mounting method according to an embodiment of the present invention can be implemented without causing an increase in costs as compared with the prior art.

Figure 7:
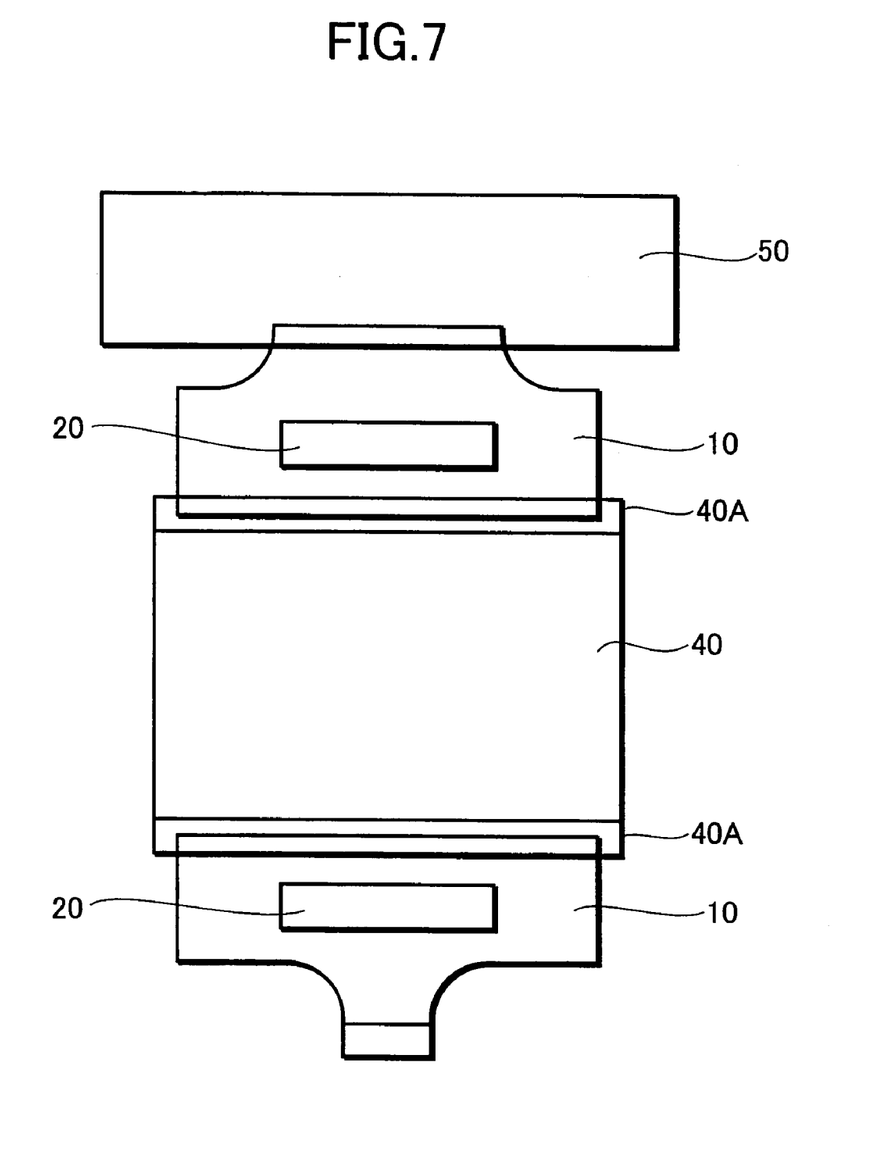
FIG. 7 is a plan view illustrating a display device or an electronic appliances incorporating a flexible circuit board mounted with a semiconductor chip according to an embodiment of the present invention.

FIG. 7 is a plan view illustrating a display device or an electronic appliances incorporating a flexible circuit board mounted with a semiconductor chip according to the aforementioned embodiments of the present invention. By way of example, a flexible circuit board 10(COF) mounted with a semiconductor chip 20 is connected to a flat-panel display device 40 such as an organic EL display, a liquid crystal display (LCD), a field emission display (FED), or a plasma display device (PDP). The flexible circuit board mounted with a semiconductor chip can be connected to lead electrodes 40A formed on a side of the display device 40 or to other circuit components such as a PWB (a hard printed wiring board).

A display device incorporating the flexible circuit board mounted with a semiconductor chip according to this embodiment employs the wiring size of the flexible circuit board which agrees with the bump size of the semiconductor chip for the COF technique, thereby allowing the bumps to be each connected to the wirings with high accuracy. Thus, it is possible to supply predetermined drive currents to the display device without any variations. In particular, this makes it possible to provide a good display performance to an organic EL display device whose display performance is directly affected by the magnitude of drive currents.

According to the aforementioned embodiments of the present invention, it is possible to prevent unsuccessful interconnection between the wirings of a flexible circuit board and the output terminals of a semiconductor chip, the flexible circuit board having a plurality of sections of wirings of different sizes, each section including a pattern of wirings of the same size. It is also possible to form patterns of wirings corresponding to the semiconductor chip having output terminals of different dimensions to provide interconnection with high accuracy. Furthermore, it is possible to thereby eliminate unevenness in drive currents which would be otherwise caused by variations in resistance across bonding surfaces, thus providing good performance to an electronic appliance, particularly to an organic EL display device whose display performance is directly affected by the magnitude of the drive currents.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A flexible circuit board with predetermined patterns of wirings to be electrically connected to output terminals of a semiconductor chip, the flexible circuit board comprising:
   a plurality of sections of wirings of different sizes, each section having a pattern of said wirings of the same size; and
   a pattern transition region formed between adjacent sections of said wirings of different sizes to prevent unsuccessful interconnection otherwise caused by a difference in size between the wirings,
   wherein said pattern transition region has a wiring interval larger than any wiring pitch in an arrangement direction of adjacent wirings at said adjacent wiring sections, said wiring interval and said wiring pitch being a distance between respective central lines of the adjacent wirings.

2. The flexible circuit board according to claim 1, wherein said pattern transition region has at least one wiring of a size intermediate between sizes of the wirings in said adjacent wiring sections.

3. The flexible circuit board according to claim 1, wherein said pattern transition region has a non-signaling dummy wiring.

4. The flexible circuit board according to claim 1, wherein said difference in size between the wirings is a difference in thickness between the wirings caused by widths of the wirings.

5. A flexible circuit board mounted with a semiconductor chip in which output terminals of the semiconductor chip are electrically connected to wirings of the flexible circuit board according to claim 1, wherein said semiconductor chip has output terminals of different dimensions, and said sizes of wirings are different from each other in width of the wirings corresponding to the dimensions of said output terminals.

6. A display device incorporating the flexible circuit board mounted with a semiconductor chip according to claim 5.

7. A method for mounting a semiconductor chip onto a flexible circuit board by electrically connecting predetermined patterns of output terminals of said semiconductor chip to patterns of wirings of said flexible circuit board, said patterns of wirings corresponding to said patterns of output terminals, said method comprising the steps of:
   providing a flexible circuit board having a plurality of sections of wirings of different sizes formed thereon, each section having a pattern of said wirings of the same size, and a pattern transition region formed between adjacent sections of said wirings of different sizes to prevent unsuccessful interconnection otherwise caused by a difference in size between the wirings; and
   aligning said patterns of the output terminals with said patterns of the wirings in said wiring sections for electrical interconnections,
   wherein said pattern transition region has a wiring interval larger than any wiring pitch in an arrangement direction of adjacent wirings at said adjacent wiring sections, said wiring interval and said wiring pitch being a distance between respective central lines of the adjacent wirings.

8. The method for mounting a semiconductor chip according to claim 7, wherein said wirings and said output terminals are each electrically interconnected with an anisotropic conductive film interposed between said respective wirings and said respective output terminals.

9. The method for mounting a semiconductor chip according to claim 7, wherein said pattern transition region has at least one wiring of a size intermediate between sizes of the wirings in said adjacent wiring sections.

10. The method for mounting a semiconductor chip according to claim 7, wherein said pattern transition region has a non-signaling dummy wiring.

11. The method for mounting a semiconductor chip according to claim 7, wherein said difference in size between said wirings is a difference in thickness between the wirings caused by widths of the wirings, said widths being formed corresponding to the dimensions of said output terminals.

* * * * *